(12) United States Patent
Hoffman

(10) Patent No.: US 12,193,135 B2
(45) Date of Patent: Jan. 7, 2025

(54) PLANAR TRANSFORMER ISOLATION CIRCUIT FOR AN X-RAY SOURCE

(71) Applicant: Moxtek, Inc., Orem, UT (US)

(72) Inventor: David Hoffman, Draper, UT (US)

(73) Assignee: Moxtek, Inc., Orem, UT (US)

( * ) Notice: Subject to any disclaimer, the term of this patent is extended or adjusted under 35 U.S.C. 154(b) by 277 days.

(21) Appl. No.: 18/082,922

(22) Filed: Dec. 16, 2022

(65) Prior Publication Data

US 2023/0232521 A1 Jul. 20, 2023

Related U.S. Application Data

(60) Provisional application No. 63/299,473, filed on Jan. 14, 2022.

(51) Int. Cl.
*H05G 1/10* (2006.01)
*H01F 27/28* (2006.01)
*H01J 35/02* (2006.01)
*H05K 1/03* (2006.01)
*H05K 1/16* (2006.01)

(52) U.S. Cl.
CPC ........... *H05G 1/10* (2013.01); *H01F 27/2804* (2013.01); *H01J 35/025* (2013.01); *H05K 1/032* (2013.01); *H05K 1/165* (2013.01); *H01J 2235/02* (2013.01); *H05K 2201/0154* (2013.01)

(58) Field of Classification Search
CPC ........ H05G 1/10; H05G 1/12; H01F 27/2804; H01J 35/025; H01J 2235/02; H05K 1/032; H05K 1/165; H05K 2201/0154; H05K 1/0298
See application file for complete search history.

(56) References Cited

U.S. PATENT DOCUMENTS 7,839,254 B2 11/2010 Dinsmore et al.
2021/0319972 A1* 10/2021 Dhurjaty .................. H05G 1/20

* cited by examiner

*Primary Examiner* — Courtney D Thomas
(74) *Attorney, Agent, or Firm* — Thorpe North & Western, LLP

(57) ABSTRACT

In an x-ray source, an isolation circuit can isolate bias voltage at a cathode from a bias voltage at an alternating current source (AC source). The isolation circuit can transfer alternating current from the AC source to the cathode. The isolation circuit can be made repeatedly with minimal variation or failed parts, can be light, and can be small. The isolation circuit can include planar transformer(s). Each planar transformer can include a primary trace on a primary circuit board and a secondary trace on a secondary circuit board. The primary trace and the secondary trace can each include a spiral shape. The primary trace can be located in close proximity to the secondary trace such that alternating electrical current through the primary trace will induce alternating electrical current through the secondary trace.

20 Claims, 3 Drawing Sheets

Figure 3:
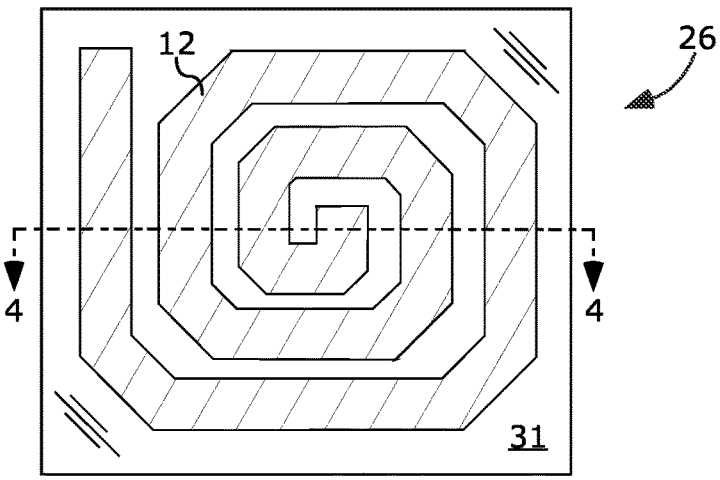

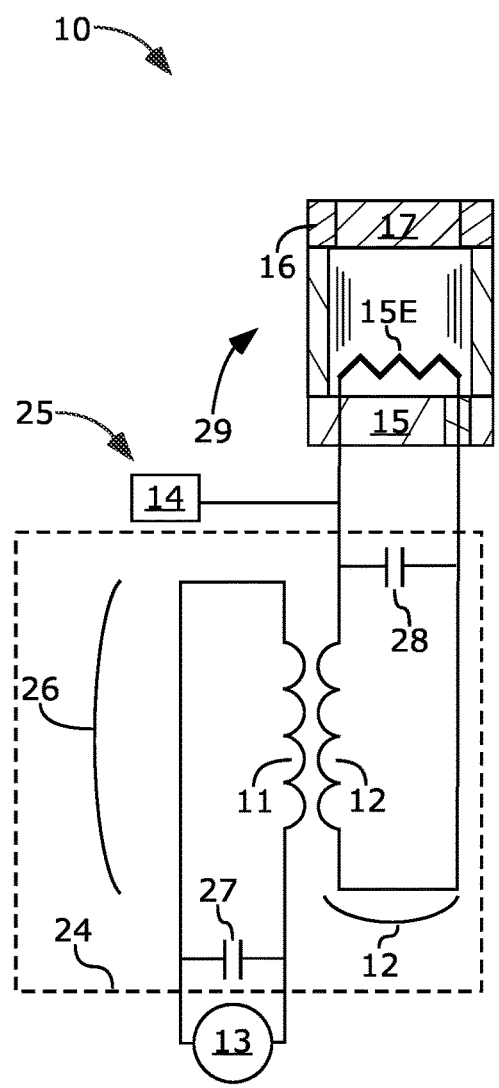
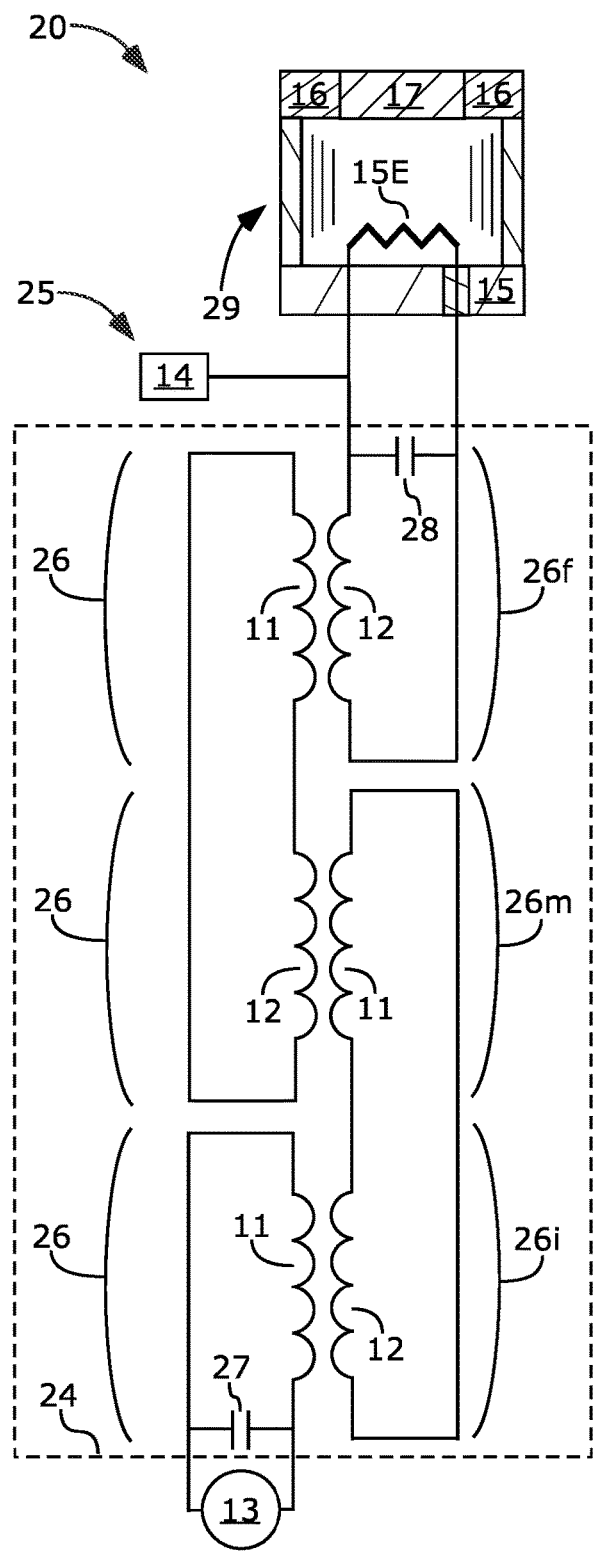
*Figure 1*  *Figure 2*

PLANAR TRANSFORMER ISOLATION CIRCUIT FOR AN X-RAY SOURCE

CLAIM OF PRIORITY

This application claims priority to U.S. Provisional Patent Application No. 63/299,473, filed on Jan. 14, 2022, which is incorporated herein by reference.

FIELD OF THE INVENTION

The present application is related to x-ray sources.

BACKGROUND

X-rays have many uses, including imaging, x-ray fluorescence analysis, x-ray diffraction analysis, and electrostatic dissipation.

High voltage power supplies can provide a large voltage, such as for example tens of kilovolts. X-ray sources can use high voltage power supplies.

A large voltage between a cathode and an anode of the x-ray tube, and sometimes a heated filament, can cause electrons to emit from the cathode to the anode. The anode can include a target material. The target material can generate x-rays in response to impinging electrons from the cathode.

BRIEF DESCRIPTION OF THE DRAWINGS (Drawings might not be drawn to scale.)

FIG. 1 is a cross-sectional side-view and schematic of an x-ray source 10 with an x-ray tube 29 and a power supply 25. The power supply 25 can include an isolation circuit 24 electrically coupled between an alternating current source 13 (AC source 13) and a cathode 15. The isolation circuit 24 can include a planar transformer 26 with a primary trace 11 and a secondary trace 12.

FIG. 2 is a cross-sectional side-view and schematic of an x-ray source 20, similar to x-ray source 10. The isolation circuit 24 in x-ray source 20, however, includes multiple planar transformers 26. The primary trace 11 of each planar transformer 26, except for an initial planar transformer 26i, can be electrically coupled to the secondary trace 12 of an adjacent or proximate planar transformer 26. The AC source 13 can be electrically coupled to the primary trace 11 of the initial planar transformer 26i. The secondary trace 12 of a final planar transformer 26f can be electrically coupled to the cathode 15.

FIG. 3 is a top-view of a planar transformer 26 for an isolation circuit 24, illustrating a spiral shape of the secondary trace 12. The primary trace 11 can have a similar spiral shape.

Figure 4:
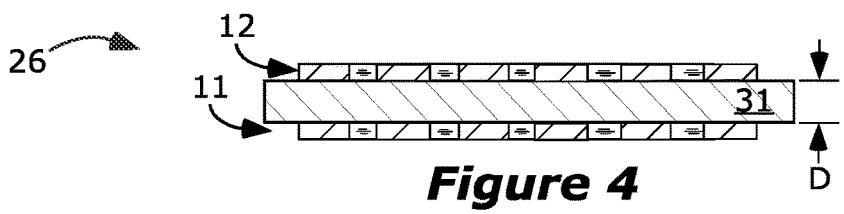

FIG. 4 is a cross-sectional side-view of the planar transformer 26 of FIG. 3, taken along line 4-4 in FIG. 3.

Figure 5:
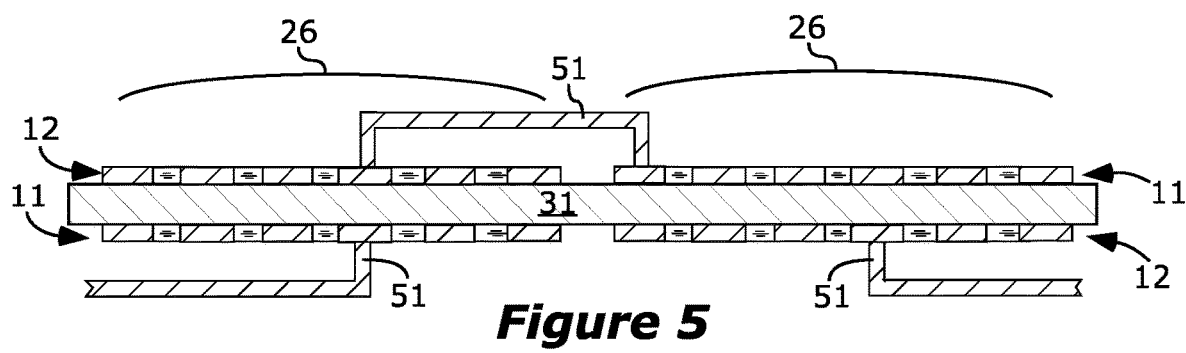

FIG. 5 is a cross-sectional side-view of multiple planar transformers 26 for an isolation circuit 24. The primary traces 11 and the secondary traces 12 for all planar transformers 26 can be mounted on a single circuit board 31.

Figure 6A:
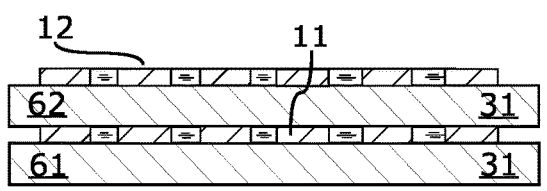

FIG. 6a is a cross-sectional side-view of a planar transformer 26 for an isolation circuit 24. The planar transformer 26 can have a primary trace 11 on a primary circuit board 61 and a secondary trace 12 on a secondary circuit board 62. The primary trace 11 can be sandwiched between the primary circuit board 61 and the secondary circuit board 62.

Figure 6B:
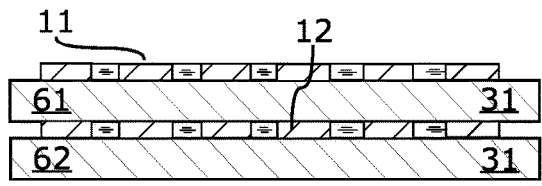

FIG. 6b is a cross-sectional side-view of a planar transformer 26 for an isolation circuit 24, similar to the planar transformer 26 of FIG. 6a. In FIG. 6b, however, the secondary trace 12 is sandwiched between the primary circuit board 61 and the secondary circuit board 62.

Figure 7:
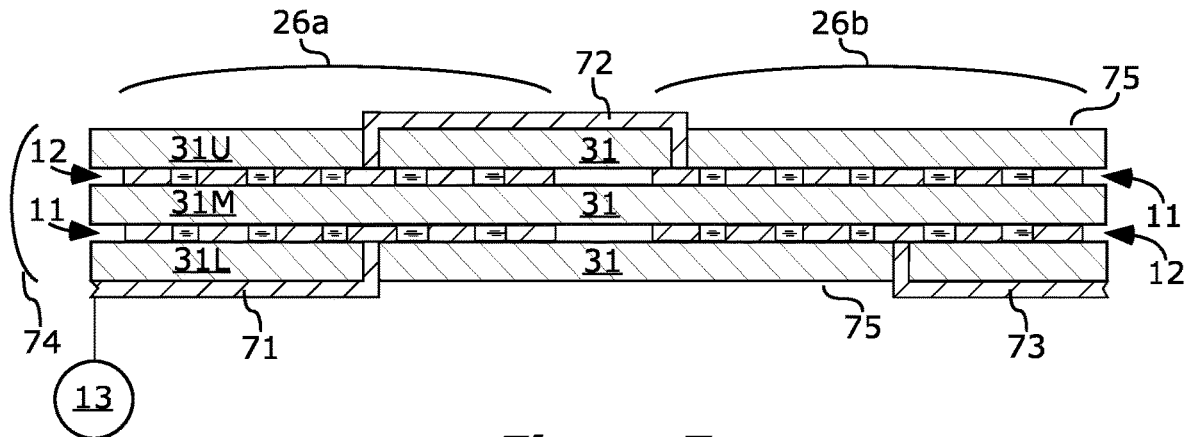

FIG. 7 is a cross-sectional side-view of multiple planar transformers 26 for an isolation circuit 24. Each planar transformer 26 can include a stack 74 of three circuit boards 31. Each primary trace 11 and each secondary trace 12 can be sandwiched between two of the three circuit boards 31 in the stack 74.

Figure 8:
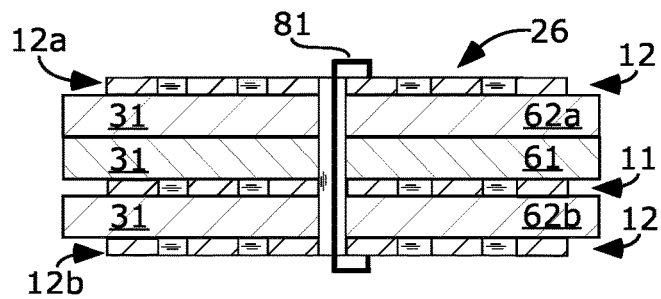

FIG. 8 is a cross-sectional side-view of a planar transformer 26 for an isolation circuit 24. The secondary trace 12 is divided into two secondary trace parts 12a and 12b. The primary trace 11 is sandwiched between the two secondary trace parts 12a and 12b.

Figure 9:
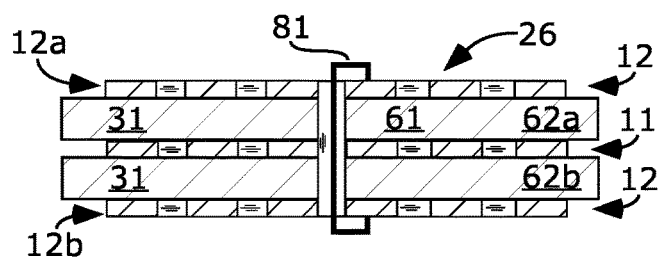

FIG. 9 is a cross-sectional side-view of a planar transformer 26 for an isolation circuit 24, similar to the planar transformer 26 of FIG. 8. In FIG. 9, however, one of the two secondary trace parts 12a shares a circuit board 31 with the primary trace 11.

DEFINITIONS

The following definitions, including plurals of the same, apply throughout this patent application.

As used herein, the terms "on", "located on", "located at", and "located over" mean located directly on or located over with some other solid material between. The terms "located directly on", "adjoin", "adjoins", and "adjoining" mean direct and immediate contact.

As used herein, the term "parallel" means exactly parallel; parallel within normal manufacturing tolerances; or almost exactly parallel, such that any deviation from exactly parallel would have negligible effect for ordinary use of the device.

As used herein, the term "x-ray tube" is not limited to tubular/cylindrical shaped devices. The term "tube" is used because this is the standard term used for x-ray emitting devices.

DETAILED DESCRIPTION

In an x-ray source, an isolation circuit can isolate bias voltage at a cathode from a bias voltage at an alternating current source, and can transfer the alternating current from the alternating current source to the cathode. An isolation circuit is described in U.S. Pat. No. 7,839,254.

Prior art isolation circuits suffer from variation in manufacturing. Such variation can result in failure of some units. For example, the prior art isolation circuits are typically made by manually winding a wire onto a transformer core. This is costly and error prone. During manufacturing, insulation on manually-wound wires can be accidently cut, resulting in failure of the isolation circuit. Accidental selection of incorrect insulation can also result in failure. Prior art isolation circuits can also be large and heavy.

The invention herein can include an isolation circuit 24 that can be made repeatedly with minimal variation or failed parts. Reduced manufacturing failures (a) can save cost; and (b) can reduce wasted materials, thus resulting in less adverse impact on the environment.

The isolation circuit 24 herein can be light weight. Therefore, user fatigue is reduced. This is particularly useful for portable x-ray sources. For example, the inventor achieved an 86% reduction in weight of the isolation circuit 24 through use of the invention herein (from 1.46 g to 0.20 g).

The isolation circuit 24 herein can be small. This is especially useful if the x-ray source needs to be inserted into tiny cavities for x-ray analysis, imaging, or electrostatic dissipation. For example, the inventor achieved a 74% reduction in size of the isolation circuit 24 through use of the invention herein (from 411 mm³ to 107 mm³).

As illustrated in FIGS. 1-2, x-ray sources 10 and 20 can include an x-ray tube 29 and a power supply 25. The x-ray tube 29 can include a cathode 15 configured to emit electrons to a target 17 at an anode 16. The target 17 can include a material that will emit x-rays out of the x-ray tube 10 or 20 in response to impinging electrons from the cathode 15. The invention herein is applicable to both transmission target anodes and to reflective target, side-window x-ray tubes.

The power supply 25 can include (a) a voltage multiplier 14 configured to generate a bias voltage for the cathode 15, (b) an alternating current source 13 (AC source 13) configured to provide alternating current to the cathode 15, and (c) an isolation circuit 24 electrically coupled between the AC source 13 and the cathode 15.

The isolation circuit 24 can isolate the bias voltage at the cathode 15 from a bias voltage at the AC source 13. The bias voltage at the AC source 13 can be at or near ground voltage, or can be a large positive voltage. The isolation circuit 24 can transfer the alternating current from the AC source 13, at one bias voltage, to the cathode 15, at a different bias voltage. There can be tens of kilovolts of voltage differential between the bias voltage at the AC source 13 and the bias voltage at the cathode 15.

The isolation circuit 24 can include planar transformer(s) 26, each with a primary trace 11 and a secondary trace 12 on circuit board(s) 31 (see FIGS. 3-9). A preferred material for the circuit board(s) is polyimide. The primary trace 11 can be located in close proximity to the secondary trace 12 such that alternating electrical current through the primary trace 11 will induce alternating electrical current through the secondary trace 12. The primary trace 11 and the secondary trace 12 can be separated from each other solely by circuit board(s). A minimum distance D (FIG. 4) between the primary trace 11 and the secondary trace 12 can be ≥0.3 mm, ≥0.5 mm, or ≥1 mm, and ≤1.7 mm, ≤3.5 mm, or ≤5 mm.

As illustrated in FIG. 1, the isolation circuit 24 can include a single planar transformer 26. The AC source 13 can be electrically coupled to the primary trace 11, and can provide alternating current to the primary trace 11. The primary trace 11 can induce alternating current in the secondary trace 12. The secondary trace 12 can be electrically coupled to the cathode 15, and can provide alternating current to the cathode 15. The secondary trace 12 can be electrically coupled to, and provide alternating current to, an electron emitter 15E, such as a filament. The alternating current can heat the filament.

As illustrated in FIG. 2, the isolation circuit 24 can comprise multiple planar transformers 26, including an initial planar transformer 26$i$ and a final planar transformer 26$f$. The primary trace 11 of each planar transformer 26, except for the initial planar transformer 26$i$, can be electrically coupled to the secondary trace 12 of an adjacent or proximate planar transformer 26. The AC source 13 can be electrically coupled to the primary trace 11 of the initial planar transformer 26$i$. The secondary trace 12 of the final planar transformer 26$f$ can be electrically coupled to the cathode 15. The secondary trace 12 can be electrically coupled to an electron emitter 15E, such as a filament. The alternating current can heat the filament.

Also illustrated in FIG. 2 is a middle planar transformer 26$m$ between the initial planar transformer 26$i$ and the final planar transformer 26$f$. The primary trace 11 of the middle planar transformer 26$m$ can be electrically coupled to the secondary trace 12 of the initial planar transformer 26$i$. The primary trace 11 of the final planar transformer 26$f$ can be electrically coupled to the secondary trace 12 of the middle planar transformer 26$m$.

If the isolation circuit 24 includes more than one middle planar transformer 26$m$, then the secondary trace 12 of one middle planar transformer 26$m$ can be electrically coupled to the primary trace 11 of another middle planar transformer 26$m$.

In the isolation circuit 24 of FIG. 1 or FIG. 2, a primary capacitor 27 can be electrically-coupled in parallel with the primary trace 11 of the initial planar transformer 26$i$. This primary capacitor 27 can be designed to resonate with the circuit for improved electrical power transfer. A secondary capacitor 28 can be electrically-coupled in parallel with the secondary trace 12 of the final planar transformer 26$f$. This secondary capacitor 28 can be designed to resonate with the load (e.g. electron emitter 15E) for improved electrical power transfer.

The isolation circuit 24 can transfer the alternating current with minimal or no change of voltage or current. Thus for example, 0.1≤Ai/Af≤10, 0.2≤Ai/Af≤5, or Ai=Af, where Ai is an amplitude of alternating electrical current through the primary trace 11 of the initial planar transformer 26$i$ and Af is an amplitude of alternating electrical current through the secondary trace 12 of the final planar transformer 26$f$. As another example, 0.1≤Ap/As≤10, 0.2≤Ap/As≤5, or Ap=As, where Ap is an amplitude of alternating electrical current through the primary trace 11 and As is an amplitude of alternating electrical current through the secondary trace 12 of any specified stage 26$i$, 26$m$, 26$f$, or combinations thereof.

A top-view of a planar transformer 26 for an isolation circuit 24 is illustrated in FIG. 3. The secondary trace 12 can have or include a spiral shape, as shown in FIG. 3. The primary trace 11 can also have or include a spiral shape. Each spiral shape can be located in a single plane. The spiral shapes can apply to any example described herein.

FIG. 4 is a cross-sectional side-view of the planar transformer 26 of FIG. 3. The primary trace 11 is on an opposite side of the circuit board 31. Thus, the primary trace 11 and the secondary trace 12 can be on opposite sides of the same circuit board 31.

FIG. 5 is a cross-sectional side-view of an isolation circuit 24 with multiple planar transformers 26. A single circuit board 31 is used for the primary traces 11 and for the secondary traces 12 for all planar transformers 26. Each primary trace 11 can be electrically coupled by wires 51 to a secondary trace 12 or to the AC source 13 (not shown in FIG. 5). Each secondary trace 12 can be electrically coupled by wires 51 to a primary trace 11 or to the cathode 11 (not shown in FIG. 5).

As illustrated in the planar transformers 26 of FIGS. 6$a$ and 6$b$, the primary trace 11 can be on a primary circuit board 61 and the secondary trace 12 can be on a secondary circuit board 62. The primary circuit board 61 and the secondary circuit board 62 can be separate from each other, and spaced apart from each other.

The primary trace 11 can be sandwiched between the primary circuit board 61 and the secondary circuit board 62 (FIG. 6$a$). The example of FIG. 6$a$ is preferred if the primary trace 11 needs to be shielded.

Alternatively, the secondary trace 12 can be sandwiched between the primary circuit board 61 and the secondary circuit board 62 (FIG. 6$b$). The example of FIG. 6$b$ is preferred if the secondary trace 12 needs to be shielded. In FIGS. 1-2, for each planar transformer 26, the secondary trace 12 would have a higher voltage than the primary trace 11 across the circuit board 31. Therefore, normally it would be more important to shield the secondary trace 12, and the example of FIG. 6b is usually preferred.

FIG. 7 is a cross-sectional side-view of multiple planar transformers 26 for an isolation circuit 24, including a first planar transformer 26a and a second planar transformer 26b. Each planar transformer 26 can comprise a stack 74 of three circuit boards 31, including a middle circuit board 31M sandwiched between an upper circuit board 31U and a lower circuit board 31L. Each of the three circuit boards 31 can be used for all of the multiple planar transformers 26 in this isolation circuit 24.

Each primary trace 11 and each secondary trace 12 can be sandwiched between two of the three circuit boards 31 in the stack 74. The primary traces 11 and the secondary traces 12 of the multiple planar transformers 26 can include spiral shapes, each of which can be embedded between two of the three circuit boards 31 of the stack 74.

The isolation circuit 24 can include three connections 71, 72, and 73 along an outer face 75 of the stack 74, and through an outer circuit board 31L or 31U to a primary trace 11, to a secondary trace 12, or both. Each of these three connections 71, 72, and 73 can be a trace along the outer face 75.

A first connection 71 can extend from the AC source 13, across the outer face 75 of the lower circuit board 31L, then through the lower circuit board 31L to the primary trace 11 of the first planar transformer 26a.

A second connection 72 can extend (a) from the secondary trace 12 of the first planar transformer 26a, (b) through the upper circuit board 31U, (c) across the outer face 75 of the upper circuit board 31U, and (d) then back through the upper circuit board 31U to the primary trace 11 of the second planar transformer 26b.

A third connection 73 can extend from the secondary trace 12 of the second planar transformer 26b, through the lower circuit board 31L, across the outer face 75 of the lower circuit board 31L, then to the cathode 15 (not shown in FIG. 7), or back through the lower circuit board 31L to the primary trace 12 of another planar transformer (not shown in FIG. 7).

The stack 74 of three circuit boards 31 can allow easier and more repeatable manufacturing. Electrical connections to a center of the spiral shape of the primary traces 11 and the secondary traces 12 can be traces through the circuit board 31 and along the outer faces 75 of the stack 74. This can be more repeatable and less expensive than manually soldering wires.

FIGS. 8 and 9 are cross-sectional side-views of planar transformers 26 for isolation circuits 24. The secondary trace 12 can be divided into two secondary trace parts 12a and 12b. The primary trace 11 can be sandwiched between the two secondary trace parts 12a and 12b. This can improve electromagnetic coupling between the primary trace 11 and the secondary trace 12, and allow increased turns in the secondary trace 12.

The secondary circuit board 62 can include two secondary circuit boards 62a and 62b. The two secondary circuit boards 62a and 62b can be separate and spaced apart from each other. One of the two secondary trace parts 12a can be on one of the two secondary circuit boards 62a and the other of the two secondary trace parts 12b can be on the other of the two secondary circuit boards 62b. The primary trace 11 can be sandwiched between the two secondary circuit boards 62a and 62b. The two secondary circuit boards 62a and 62b can be parallel with respect to each other.

As illustrated in FIG. 8, the primary circuit board 61 can be a different circuit board 31 than either of the two secondary circuit boards 62a and 62b. This can be easier for manufacturing. As illustrated in FIG. 9, the primary circuit board 61 can be the same circuit board 31 as one of two secondary circuit boards 62a. This can improve electromagnetic coupling between the primary trace 11 and the secondary trace 12.

The two secondary trace parts 12a and 12b can be connected at a center of the spiral shape, defining a secondary trace connection 81. The secondary trace connection 81 can extend through, such as preferably through a center of, the primary circuit board 61 and the secondary circuit boards 62a and 62b.

The spiral shape of one of the two secondary trace parts 12a (or 12b) can spiral in and the spiral shape of the other of the two secondary trace parts 12b (or 12a) can spiral out. The spiral direction is defined as a direction of current flow at a single point in time.

What is claimed is:

1. An x-ray source comprising:
an x-ray tube and a power supply;
an x-ray tube including a cathode configured to emit electrons towards a target at an anode, the target configured to emit x-rays out of the x-ray tube in response to impinging electrons from the cathode;
the power supply including (a) a voltage multiplier configured to generate a bias voltage for the cathode, (b) an alternating current source (AC source) configured to provide alternating current to the cathode, and (c) an isolation circuit electrically coupled between the AC source and the cathode;
the isolation circuit is configured to (a) isolate the bias voltage at the cathode from a bias voltage at the AC source, and (b) transfer the alternating current from the AC source to the cathode;
the isolation circuit includes multiple planar transformers, including an initial planar transformer and a final planar transformer;
each planar transformer includes (a) a primary trace on a primary circuit board, the primary trace including a spiral shape; (b) a secondary trace on a secondary circuit board, the secondary trace including a spiral shape; and (c) the primary trace is located in close proximity to the secondary trace such that alternating electrical current through the primary trace will induce alternating electrical current through the secondary trace;
the primary trace of each planar transformer, except for the initial planar transformer, is electrically coupled to the secondary trace of a proximal planar transformer, such that alternating electrical current through the primary trace also flows through the secondary trace of the proximal planar transformer;
the AC source is electrically coupled to, and is configured to provide alternating current through, the primary trace of the initial planar transformer; and
the secondary trace of the final planar transformer is electrically coupled to the cathode and is configured to provide alternating current through the cathode.

2. The x-ray source of claim 1, further comprising:
each planar transformer includes a third circuit board;
the primary circuit board, the secondary circuit board, and the third circuit board form a stack of three circuit boards;

each primary trace and each secondary trace is sandwiched between two of the three circuit boards in the stack; and a connection between the primary trace of one planar transformer to the secondary trace of another planar transformer passes through one of the three circuit boards from the primary trace to an outer face of the stack and from the outer face of the stack through the one of the three circuit boards to the secondary trace.

3. The x-ray source of claim 2, wherein each primary trace adjoins two circuit boards and each secondary trace adjoins two circuit boards.

4. The x-ray source of claim 1, wherein for each planar transformer, the primary circuit board and the secondary circuit board are a single circuit board.

5. The x-ray source of claim 4, wherein the single circuit board for each planar transformer is one circuit board for all planar transformers.

6. The x-ray source of claim 1, wherein each spiral shape is located in a single plane.

7. The x-ray source of claim 1, wherein:
the initial planar transformer further comprises a primary capacitor electrically-coupled in parallel with its primary trace; and
the final planar transformer further comprises a secondary capacitor electrically-coupled in parallel with its secondary trace.

8. The x-ray source of claim 1, wherein $0.1 \leq Ap/As \leq 10$, where Ap is an amplitude of alternating electrical current through the primary trace of the initial planar transformer and As is an amplitude of alternating electrical current through the secondary trace of the final planar transformer.

9. The x-ray source of claim 1, wherein:
the multiple planar transformers further comprise a middle planar transformer between the initial planar transformer and the final planar transformer;
the primary trace of the middle planar transformer is electrically coupled to the secondary trace of the initial planar transformer; and
the primary trace of the final planar transformer is electrically coupled to the secondary trace of the middle planar transformer.

10. The x-ray source of claim 1, wherein for each planar transformer:
the secondary trace is divided into two secondary trace parts, the secondary circuit board includes two secondary circuit boards, the two secondary circuit boards being separate and spaced apart from each other;
one of the two secondary trace parts is on one of the two secondary circuit boards and the other of the two secondary trace parts is on the other of the two secondary circuit boards; and
the primary trace is sandwiched between the two secondary trace parts.

11. The x-ray source of claim 10, wherein the two secondary circuit boards are parallel with respect to each other.

12. The x-ray source of claim 10, wherein the primary circuit board is the same circuit board as one of the two secondary circuit boards.

13. The x-ray source of claim 10, wherein:
the two secondary trace parts are connected at a center of the spiral shape defining a secondary trace connection; and
the secondary trace connection extends through a center of the primary circuit board.

14. The x-ray source of claim 10, wherein the spiral shape of one of the two secondary trace parts spirals in and the spiral shape of the other of the two secondary trace parts spirals out, spiral direction being defined as a direction of current flow at a single point in time.

15. The x-ray source of claim 1, wherein for each planar transformer, the primary circuit board is the same circuit board as at least part of the secondary circuit board.

16. The x-ray source of claim 1, wherein for each planar transformer, the primary circuit board and the secondary circuit board comprise polyimide.

17. An x-ray source comprising:
an x-ray tube and a power supply;
an x-ray tube including a cathode configured to emit electrons towards a target at an anode, the target configured to emit x-rays out of the x-ray tube in response to impinging electrons from the cathode;
the power supply including (a) a voltage multiplier configured to generate a bias voltage for the cathode, (b) an AC source configured to provide alternating current to the cathode, and (c) an isolation circuit electrically coupled between the AC source and the cathode;
the isolation circuit is configured to isolate the bias voltage at the cathode from a bias voltage at the AC source, and transfer the alternating current from the AC source to the cathode;
the isolation circuit includes a planar transformer with a primary trace on a primary circuit board and a secondary trace on a secondary circuit board;
the primary trace and the secondary trace each include a spiral shape;
the primary trace is located in close proximity to the secondary trace such that alternating electrical current through the primary trace will induce alternating electrical current through the secondary trace;
the AC source is electrically coupled to the primary trace; and
the secondary trace is electrically coupled to the cathode and is configured to provide alternating current through the cathode.

18. The x-ray source of claim 17, wherein $0.2 \leq Ap/As \leq 5$, where Ap is an amplitude of alternating electrical current through the primary trace and As is an amplitude of alternating electrical current through the secondary trace.

19. An x-ray source comprising:
an x-ray tube and a power supply;
an x-ray tube including a cathode configured to emit electrons towards a target at an anode, the target configured to emit x-rays out of the x-ray tube in response to impinging electrons from the cathode;
the power supply including (a) a voltage multiplier configured to generate a bias voltage for the cathode, (b) an AC source configured to provide alternating current to the cathode, and (c) an isolation circuit electrically coupled between the AC source and the cathode;
the isolation circuit is configured to (a) isolate the bias voltage at the cathode from a bias voltage at the AC source, and (b) transfer the alternating current from the AC source to the cathode;
the isolation circuit includes multiple planar transformers, including an initial planar transformer and a final planar transformer;
each planar transformer includes (a) a primary trace on a primary circuit board, the primary trace including a spiral shape; (b) a secondary trace on a secondary circuit board, the secondary trace including a spiral shape; and (c) the primary trace is located in close proximity to the secondary trace such that alternating electrical current through the primary trace will induce alternating electrical current through the secondary trace;

the primary trace of each planar transformer, except for the initial planar transformer, is electrically coupled to the secondary trace of a proximal planar transformer, such that alternating electrical current through the primary trace also flows through the secondary trace of the proximal planar transformer;

the secondary trace for each planar transformer is divided into two secondary trace parts, the secondary circuit board includes two secondary circuit boards, the two secondary circuit boards being separate and spaced apart from each other;

one of the two secondary trace parts is on one of the two secondary circuit boards and the other of the two secondary trace parts is on the other of the two secondary circuit boards;

the primary trace is sandwiched between the two secondary trace parts;

the two secondary trace parts are connected at a center of the spiral shape defining a secondary trace connection;

the secondary trace connection extends through a center of the primary circuit board; and the spiral shape of one of the two secondary trace parts spirals in and the spiral shape of the other of the two secondary trace parts spirals out, spiral direction being defined as a direction of current flow at a single point in time.

20. The x-ray source of claim 19, wherein the two secondary circuit boards are parallel with respect to each other.

\* \* \* \* \*